(12) United States Patent
Chait

(10) Patent No.: US 10,938,130 B1
(45) Date of Patent: Mar. 2, 2021

(54) PLUG-IN POINT ADAPTER FOR ALLIGATOR CLIP

(71) Applicant: Paul Nicholas Chait, San Rafael, CA (US)

(72) Inventor: Paul Nicholas Chait, San Rafael, CA (US)

( * ) Notice: Subject to any disclaimer, the term of this patent is extended or adjusted under 35 U.S.C. 154(b) by 0 days.

(21) Appl. No.: 16/589,576

(22) Filed: Oct. 1, 2019

Related U.S. Application Data

(60) Provisional application No. 62/739,415, filed on Oct. 1, 2018.

(51) Int. Cl.
   *H01R 11/22* (2006.01)
   *H01R 11/18* (2006.01)
   *H01R 11/24* (2006.01)

(52) U.S. Cl.
   CPC ............ *H01R 11/18* (2013.01); *H01R 11/24* (2013.01); *H01R 2201/20* (2013.01)

(58) Field of Classification Search
   CPC .. H01R 11/24; H01R 11/282; G01R 1/06788; G01R 3/00; G01R 1/06711; G01R 31/2886; G01R 1/07342; G01R 1/06772; G01R 1/07314; G01R 1/06722
   USPC ............ 439/729, 759, 829; 324/149, 754.01, 324/754.02, 754.03, 755.01–755.05
   See application file for complete search history.

(56) References Cited

U.S. PATENT DOCUMENTS

| | | | | |
|---|---|---|---|---|
| 2,754,490 A | * | 7/1956 | Schnoll ................. | H01R 11/24 439/729 |
| 4,243,285 A | * | 1/1981 | Crowley ................ | H01R 13/35 439/219 |
| 4,702,256 A | * | 10/1987 | Robinson ............. | A61B 5/0416 403/111 |
| 4,975,089 A | * | 12/1990 | Lee ........................ | H01R 11/24 439/755 |
| 5,021,008 A | * | 6/1991 | Scherer .................. | H01R 11/24 439/504 |
| 5,082,456 A | * | 1/1992 | Lan ........................ | H01R 11/24 439/504 |
| 5,234,359 A | * | 8/1993 | Takahashi .......... | G01R 1/06788 439/481 |
| 5,416,405 A | * | 5/1995 | Dill ..................... | G01R 1/06788 324/149 |
| 5,985,481 A | * | 11/1999 | Champagne ............ | H01M 6/38 429/116 |
| 6,796,841 B1 | * | 9/2004 | Cheng .................... | H01R 11/24 439/506 |

(Continued)

*Primary Examiner* — Thanh Tam T Le
(74) *Attorney, Agent, or Firm* — Larry D. Johnson

(57) ABSTRACT

A plug-in point adapter provides a self-contained adapter assembly that may be plugged into the connector jack of an existing electrical alligator clip probe and which increases the length of the probe. In some implementations, the adapter includes a test point that can be projected forward to a selectable length between the jaws of the clip that allows the clip to be used either as the point of a test probe or the original service as an alligator probe. In some implementations, the adapter transfers the alligator jack to the adapter jack for connection of the test lead plug. In some implementations, the adapter latches to the alligator clip and remains on permanently. The original alligator clip is not modified in any way and therefore the adapter can be customized for various designs of alligator clips that do not have to be modified.

20 Claims, 5 Drawing Sheets

(56) References Cited

U.S. PATENT DOCUMENTS

| | | | | |
|---|---|---|---|---|
| 7,736,201 B2* | 6/2010 | Gathman | ............... | H01R 11/24 |
| | | | | 439/759 |
| 8,922,196 B2* | 12/2014 | Chait | ................. | G01R 1/07307 |
| | | | | 324/149 |
| 9,274,144 B2* | 3/2016 | Chait | ................. | G01R 1/07364 |

* cited by examiner

PLUG-IN POINT ADAPTER FOR ALLIGATOR CLIP

CROSS REFERENCE TO RELATED APPLICATIONS

The present application claims the benefit of the filing date of U.S. Provisional Patent Application Ser. No. 62/739,415, filed Oct. 1, 2018. The foregoing application is incorporated by reference in its entirety as if fully set forth herein.

TECHNICAL FIELD

This written description relates generally to clips and probes used for electrical testing, and more particularly to an improved point adapter for use with a traditional alligator clip for electrical testing.

BACKGROUND

Alligator clips have elongated clamping jaws and are often a necessary tool in the design, testing, and maintenance of electrical equipment, from high power to microelectronic circuits. A pair of clips connected by a wire lead is called a clip lead and used to interconnect components between the point-tip of a test probe to the Device Under Test (DUT). Some test probes have a built-in clamp at the probe tip, but the large majority of probes terminate in a fixed metal point ranging from about ⅜ to 1 inch long and 2 MM in diameter. The entire probe length including the plastic rod that holds the point and the jack into which the test lead plugs-in varies from approximately 4 to 7 inches.

A common test instrument is the multimeter, with many selectable electrical readings such as volts, amperes, and Ohms in one instrument. There is also a pair of test leads, Positive and Negative, that usually terminate in plugs that connect the multimeter and probe.

The use of an alligator clip as a probe is often most advantageous for temporary connections of larger electrical testing such as batteries, bus bars and power terminals. However, those tests usually also require contacting the multimeter with a point to the DUT. Therefore if there is no point probe readily available a contact, without clamping of the probe and DUT, is often attempted by opening the jaws and contacting the DUT if possible, or using a pointed object such as a nail to be gripped by the jaws, both being potentially dangerous procedures.

U.S. Pat. Nos. 8,922,196 and 9,274,144 by applicant herein disclose devices that have a point tip and a clamp combined into one probe. Both of these tips are retracted when not in use, and when either is deployed by a plunger action, the other is auto-retracted. This dual combination has proven very effective and increases safety in all test procedures, with the opening of both clamp jaws simultaneously allowing a precise placement of the clamp on the DUT. The plunger action of these prior devices also provide more precision and ergonomic use of the hand than the thumb-forefinger pressure on the alligator clip that opens only one jaw as described in the present disclosure, although the traditional alligator clip has a larger jaw opening than the plunger action of those prior devices.

SUMMARY

Described below is a plug-in point adapter for use with an existing electrical alligator clip. In some implementations, the adapter is a self-contained assembly that can be plugged into the connector jack of an existing electrical alligator clip probe and which increases the length of the probe. In some implementations, the adapter includes a probe point that can be projected forward between the jaws of the clip that allows the clip to be used either as the point of a test probe or the original service as an alligator probe. In some implementations, the adapter transfers the existing alligator connector jack directly to the same type plug on the adapter. In some implementations, the adapter latches to the alligator clip and remains on permanently.

In some implementations, the original alligator clip is not modified in any way and the plug-in point adapter concept can be adapted to various designs of alligator clips that have a plug in jack and that do not have to be modified. These clips are manufactured by many companies worldwide. For example, the alligator clip featured in this disclosure is manufactured by Mueller Electric Co., P/N BU-65. This clip is described in many sections of IEC 61010-031 Edition 2.1 2010-05 for hand-held probes. Many sections of this 99 page testing standard also describe point probes, but there is no reference in the manual to a combination of alligator and point.

In some implementations, the plug-in point adapter described herein provides a completely self-contained unit that plugs into the connection jack of an alligator clip and allows the user to select a point or clip and alternate between them as often as desired. The original alligator clip is not modified in any way. The increase in length of the alligator clip due to the addition of the point adapter and the increase in grip also provides greater ergonomic control of the resultant probe.

The details of one or more embodiments of the subject matter described in this specification are set forth in the accompanying drawings and the description below. Other features, aspects, and advantages of the subject matter will become apparent from the description, the drawings, and the claims.

Those skilled in the art will appreciate that the conception upon which this disclosure is based readily may be utilized as a basis for the designing of other structures, methods and systems that include one or more of the various features described below.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

DETAILED DESCRIPTION

Figure 1:
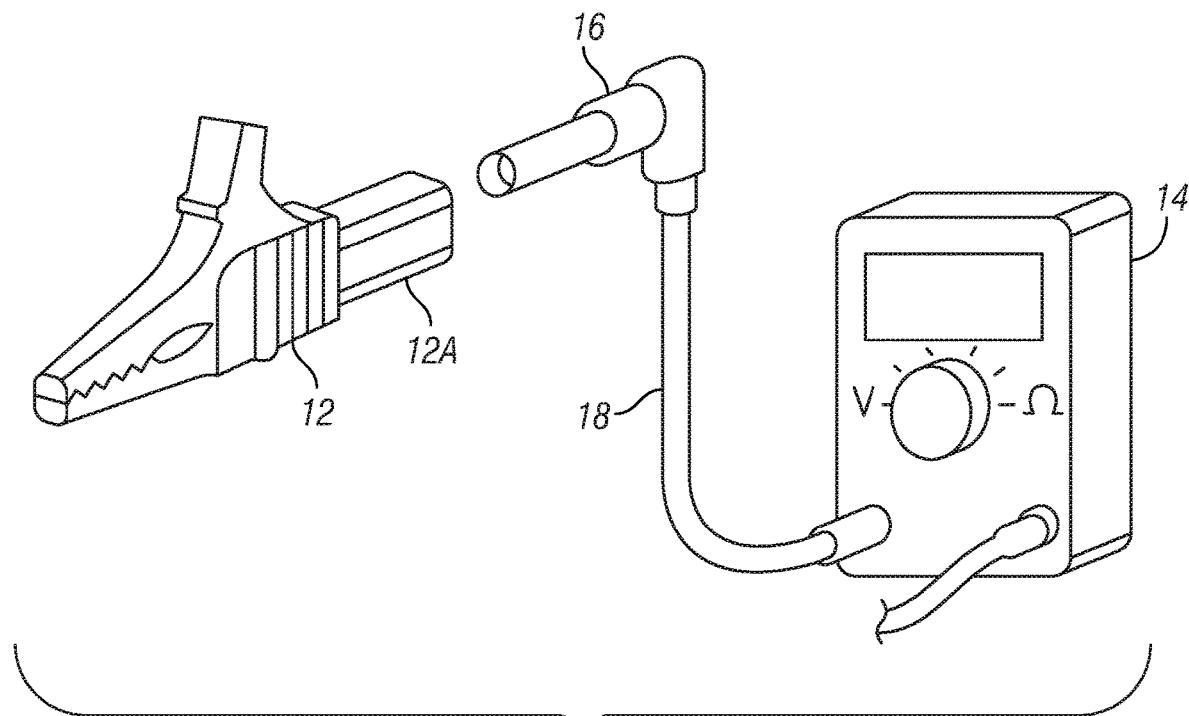
FIG. 1 is a view of a traditional alligator clip and a multimeter.

Referring to FIGS. 1 through 9, wherein like reference numerals refer to like components in the various views, there is illustrated therein a new and improved plug-in point adapter for an alligator clip, generally denominated 10 herein.

FIG. 1 is a view of a traditional alligator clip 12 and a multimeter 14. The alligator clip is typically approximately three inches long, and includes a connector jack portion 12A that connects to the multimeter via a standard plug 16 on test lead 18.

Figure 2:
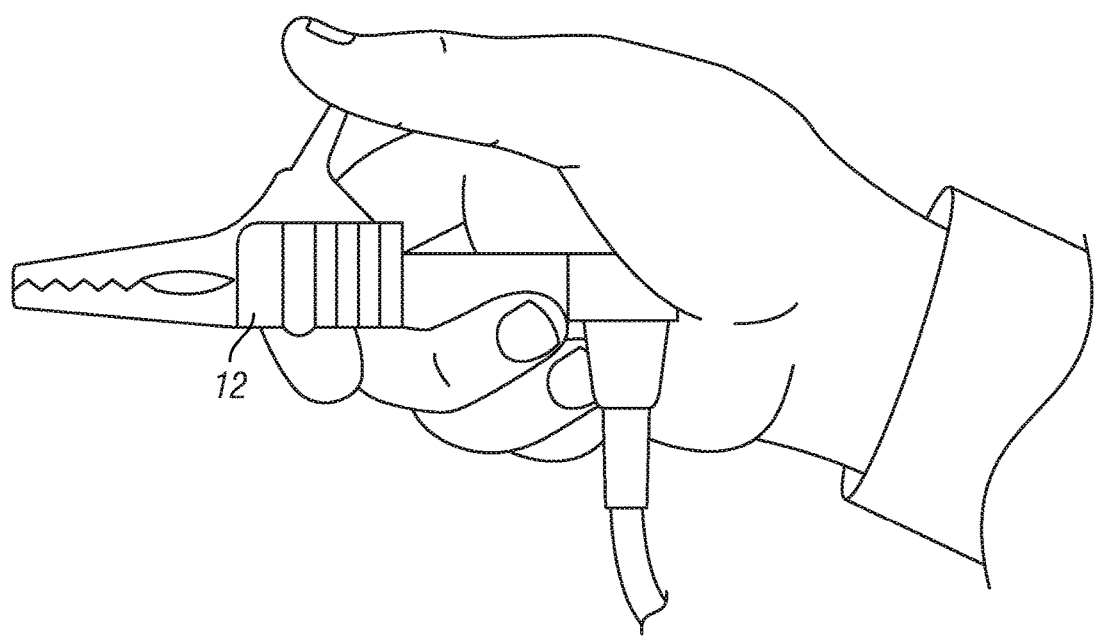
FIG. 2 is a view showing typical user gripping of a traditional alligator clip.

FIG. 2 is a view showing typical user gripping of a traditional alligator clip 12. Most users would grip an alligator clip between two fingers and thumb as shown, opening the jaws of the clip by pressing of the thumb.

Figure 3:
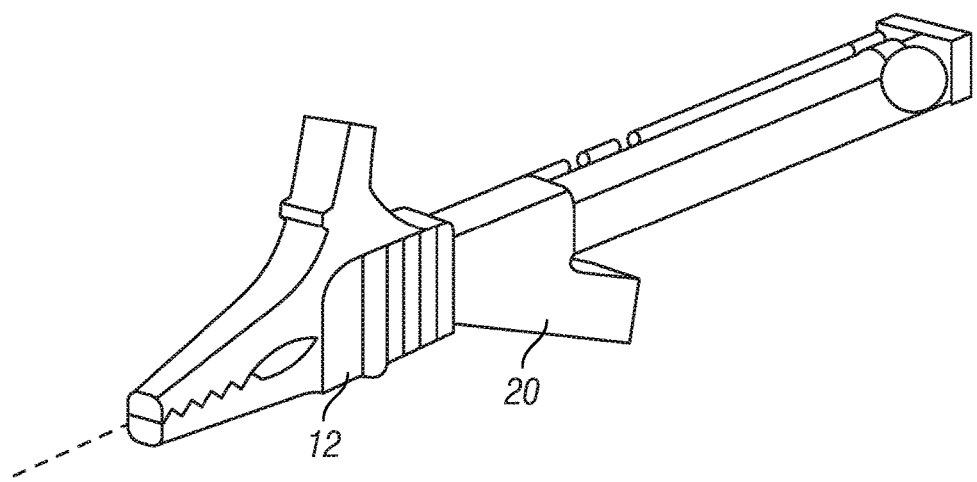
FIG. 3 is a perspective view of one implementation of a plug-in point adapter as connected to a traditional alligator clip.

FIG. 3 is a perspective view of one implementation of a plug-in point adapter 20 as connected to a traditional alligator clip 12.

Figure 4:
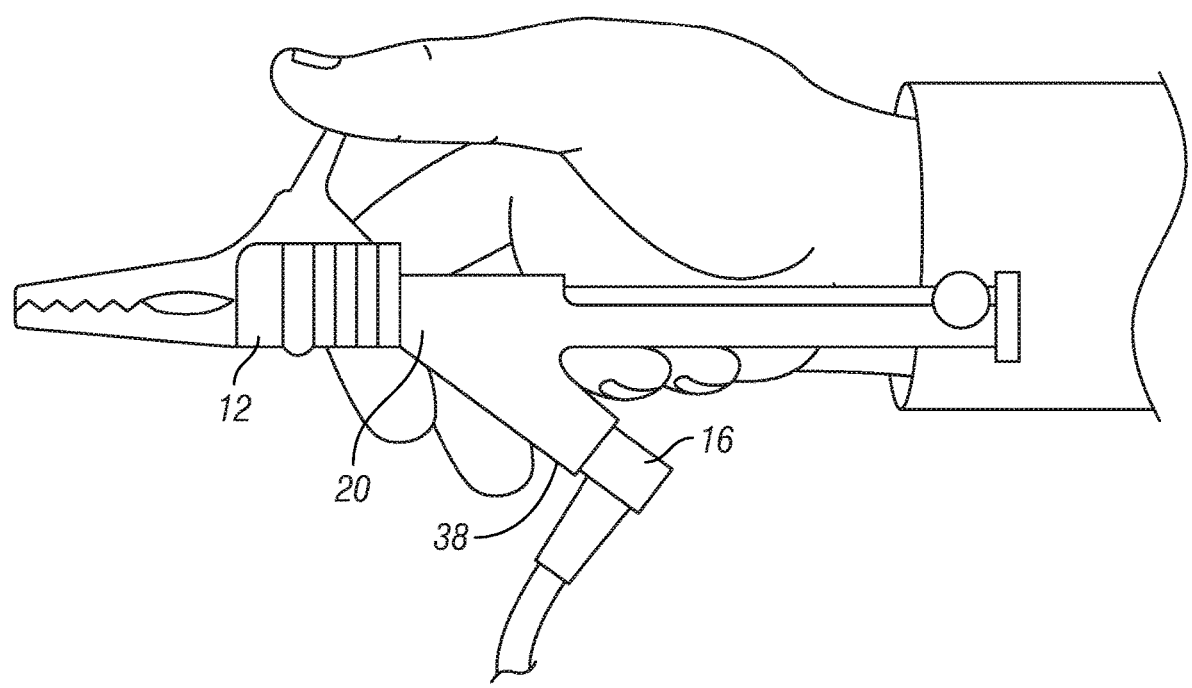
FIG. 4 is a view showing typical user gripping of a joined alligator clip and a plug-in point adapter.

FIG. 4 is a view showing typical user gripping of a joined alligator clip 12 and a plug-in point adapter 20, with test lead plug 16 now connected to the adapter at adapter jack 38. Most users would grip the joined clip and adapter between four fingers and thumb as shown, opening the jaws of the clip by pressing of the thumb in the traditional manner. The six inch total length and associated improved ergonomics of a three inch adapter joined to a three inch alligator clip is comparable to that of a traditional probe.

Figure 5:
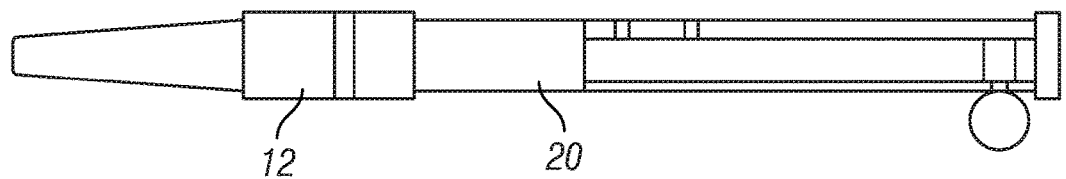
FIG. 5 is a top view of a joined alligator clip and a plug-in point adapter.

FIG. 5 is a top view of a joined alligator clip 12 and a plug-in point adapter 20.

Figure 6:
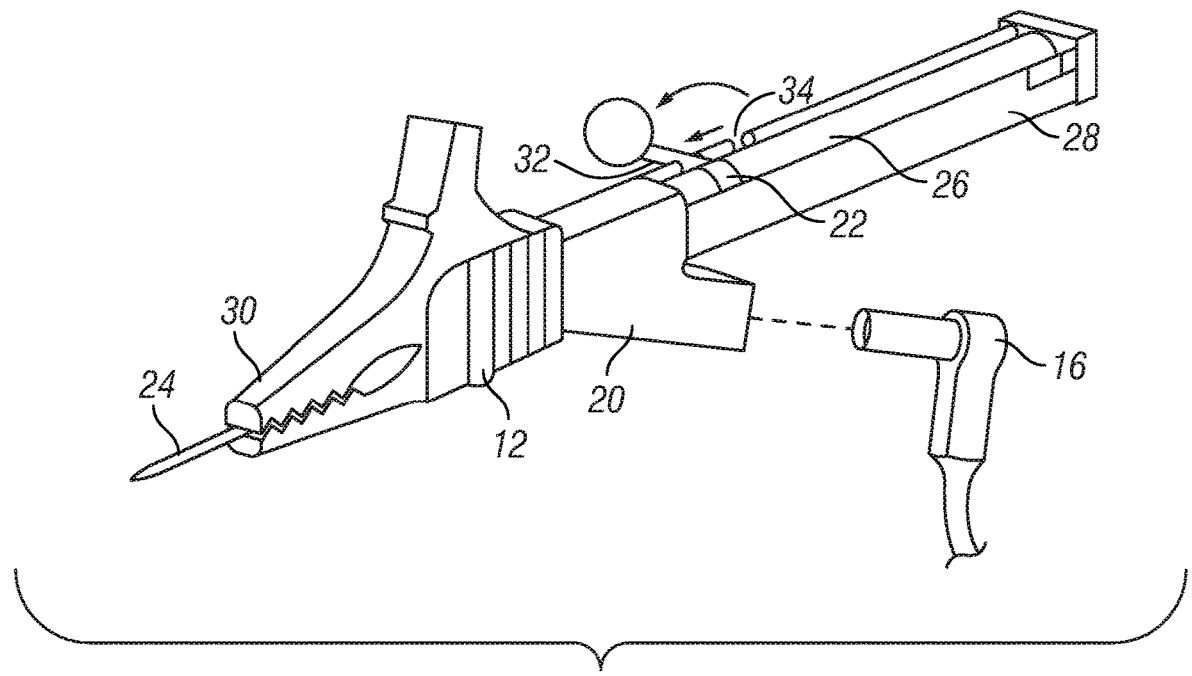
FIG. 6 is a perspective view illustrating operation of one implementation of a slide component for a plug-in point adapter joined to an alligator clip.
Figure 7:
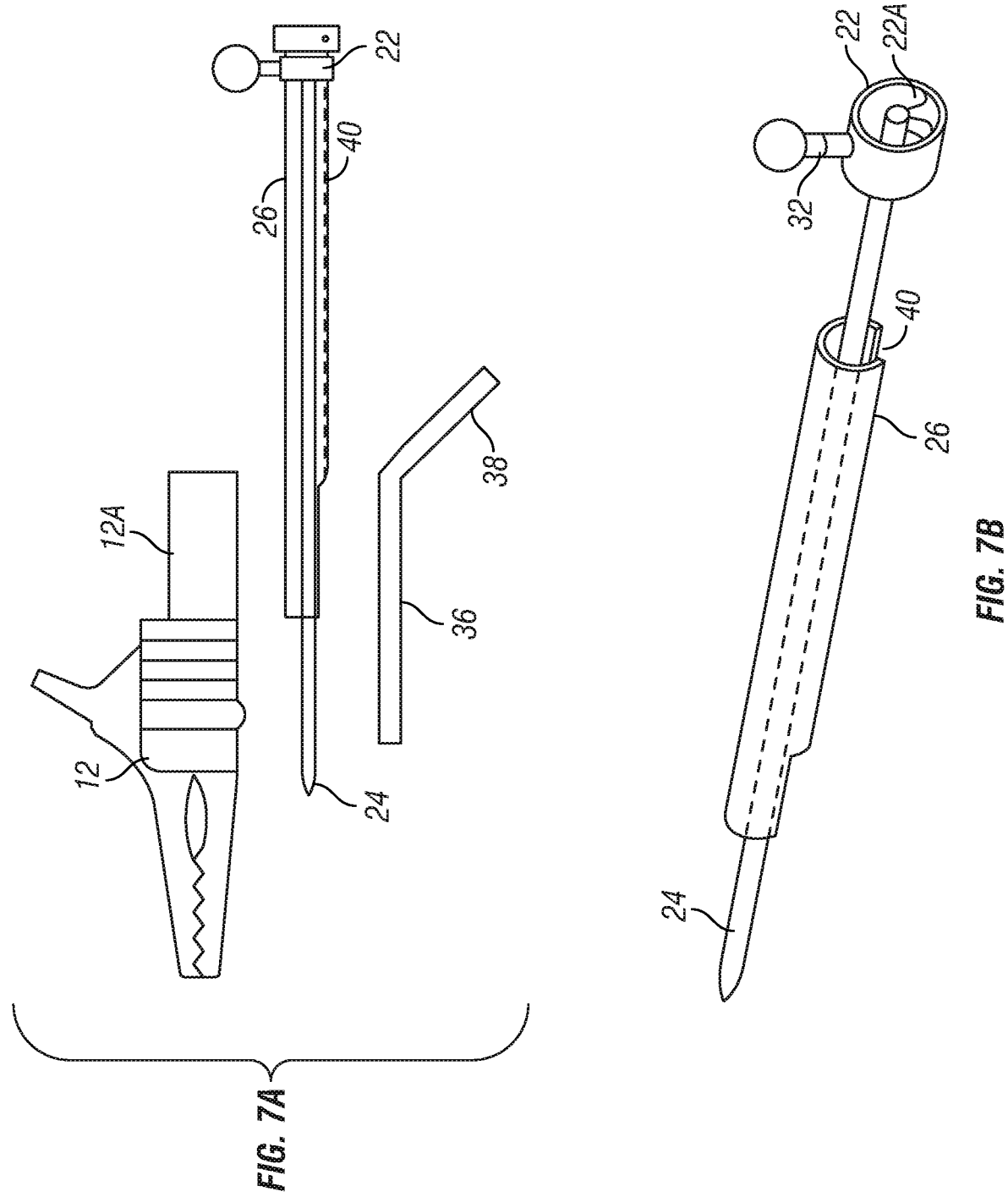
FIG. 7A is an exploded view showing an alligator clip and some of the components comprising one implementation of a plug-in point adapter.
FIG. 7B is a perspective view showing an arrangement of some of those components.

FIG. 6 is a perspective view illustrating operation of one implementation of a slide component for a plug-in point adapter 20 joined to an alligator clip 12. In some implementations, the slide component comprises a plastic slide ring 22 connected to a point 24, and is carried on slide tube 26 within housing 28, such that the slide ring 22 may be moved or slid forward on slide tube 26 to extend point 24 outward beyond the jaws 30 of clip 12. The slide ring 22 may then be rotated to engage post 32 into one of one or more grooves 34 on housing 28 to latch and temporarily lock the point 24 in that extended position. The point may therefore be deployed to one of any of the extended positions defined by the grooves in the housing (e.g., a full 1 inch or ½ inch lengths), or completely retracted within the original alligator clamp. In this view, the slide ring 22 has been slid forward and rotated into a groove in the housing corresponding to a full one inch extension of the point 24.

FIG. 7A is an exploded view showing an alligator clip 12 and some of the components comprising one implementation of a plug-in point adapter, and FIG. 7B is a perspective view showing an arrangement of a slide ring 22, point 24, and slide tube 26. In some implementations, the adapter includes a standard 2 MM metal test point 24 and the other parts to support the deployment of the point. The adapter point 24 is contained in the slide tube 26. The slide tube 26 plugs into the connector jack portion 12A of the alligator clip 12 and encloses a nickel-plated metal rod 36 that attaches into the tubular connection jack on the alligator clip and transfers this connection to the adapter at downwardly-depending adapter jack 38 (e.g., a standard size 4 MM 1-D connector). The metal rod 36 is hollow and acts as a guide for point 24 as it is extended or retracted. There is thus a strong electrical commutation between the point 24 and jack 38, and the internal components of the alligator clip and the adapter.

In some implementations, all of the exposed components of the adapter (e.g., the slide ring 22, slide tube 26, and housing 28) are constructed of non-conductive material such as plastic. Thus, all aspects of the adapter may be fully insulated in accordance with CIE and UL standards. The point assembly can be removed intact from the adapter and replaced or changed to an optional type of needle-point for micro circuit testing. An original BU-65 alligator clip is rated at 30 amperes, but with the adapter attachment in this example the device is preferably rated at 10 amperes in keeping with the standards for the 2 MM point probe.

In this implementation, the adapter point 24 shaft terminates at plastic slide ring 22 with a small section of the inside circumference of the ring connected to the point shaft forming a point support 22A. The plastic ring 22 includes a radially outward post 32 topped with a ball feature that may be used as a push to move the point forward, such that the point support 22A travels unimpeded through a longitudinal opening or slot 40 along the length of the bottom of slide tube 26.

A salient feature of this sliding bolt type of design of the adapter is that the point (bolt) 24 is connected to the inside center of the slide ring 22 encircling the slide tube 26 surrounding the point. The tube 26 has the slot 40 all along the bottom and the ball-tipped post 32 connects at the top of the outside of the ring 180 degrees from the slot. Therefore, the slot is completely covered by the housing, and the metal point is completely covered by the slide tube, slide ring, and housing when the point is retracted. The concept of a slide ring that the point attaches to and the travel of the point through a slotted tube whose slot and point push are 180 degrees apart may be important in those applications where the travel of a point must be completely covered (i.e., electrically insulated).

Figure 8:
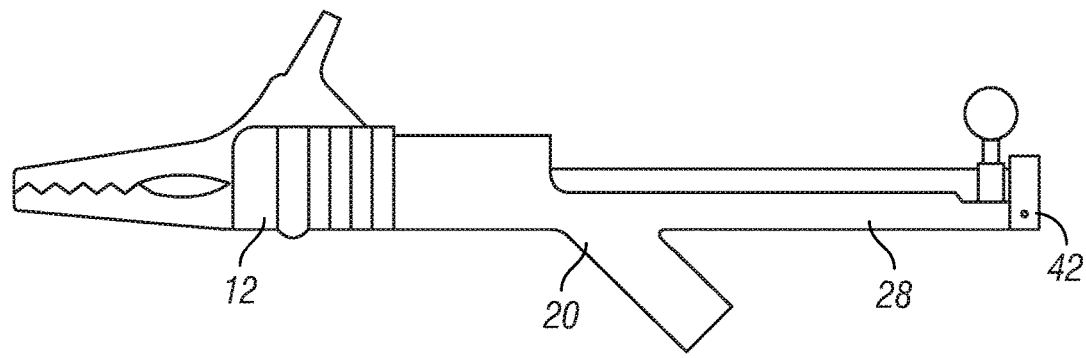
FIG. 8 is a side elevation view of one implementation of a plug-in point adapter as joined to an alligator clip.

FIG. 8 is a side elevation view of one implementation of a plug-in point adapter 20 as joined to an alligator clip 12. A rear square cap 42 at the end of the adapter housing 28 snaps into the housing and is also captive to the housing at the bottom of the cap with a flexible plastic hinge. When the cap is un-snapped and open, the entire point and plastic slide components may be removed from the adapter for replacement. For example, the point section is replaceable by pressing the rear of the housing and dropping the captive cap. There are optional points with a very fine tip for micro sections of the DUT.

The adapter is also cost effective and robust due to the simplicity of its movement and absence of springs, although it requires two hands to transfer between clamp and point, with one hand holding the alligator clip open and the other to push the point.

Figure 9:
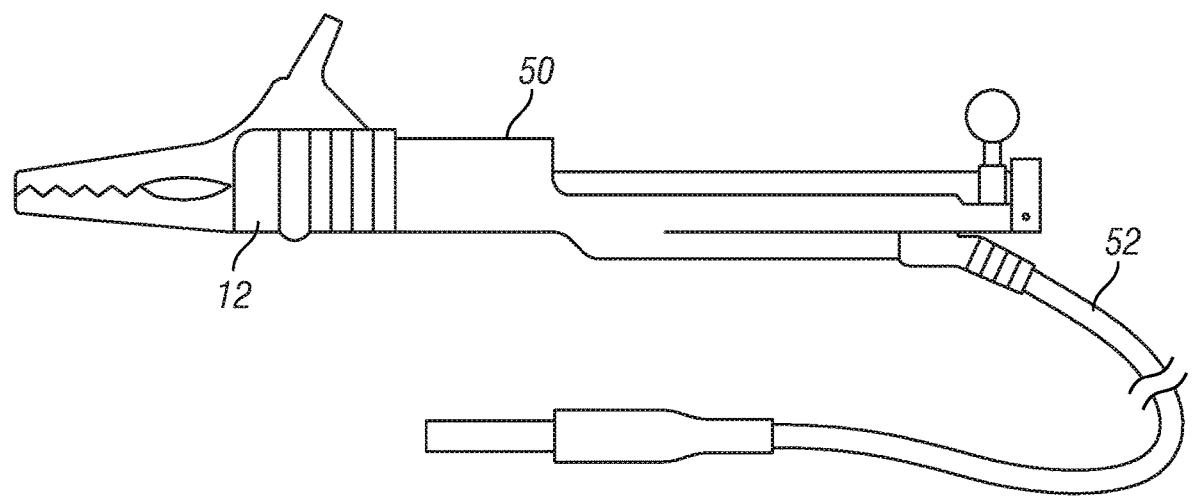
FIG. 9 is a view of an alternate implementation of a plug-in point adapter as joined to an alligator clip.

FIG. 9 is a view of an alternate implementation of a plug-in point adapter 50 as joined to an alligator clip 12. This optional alternative to a plug-in connector in the adapter housing includes an integral lead 52 (e.g., five foot long) extending from the housing and terminating in a plug.

In some implementations, the adapter may be factory-plugged into the rear jack enclosed in the rear of the housing of the alligator clip after factory insertion of a metal guide with a jack connector;

In some implementations, the alligator clip may be used as its original clamp function by thumb pressing to open or close the jaws as for any thumb press clamp;

In some implementations, to convert to a point probe, use one hand to open the jaws with the clip thumb press and while holding the jaws open, use the other hand on the slide ring post ball to extend the point forward and rotate the post into one of the grooves on the housing for the desired length of exposed point, and then release the jaw press to tighten on to the deployed point.

The plug-in point adapter for an alligator clip may thus be characterized as a self contained attachment unit that can be plugged into the jack of an existing alligator clamp test probe. The attachment has a slide and point that may be extended forward of the clamp and thereby converts the test probe from being that of a clamp type to a that of a test probe with a point as well as the dual function of reverting to the original alligator clip function when the point is not deployed. The attached unit has the same type of connector jack as the original alligator clamp and a test lead plugs into the attached unit. There is no modification of the original alligator clamp.

The plug-in point adapter may also be characterized as a point adapter for an alligator clip, the alligator clip having a pair of jaws and a connector jack for connection to a plug on a wire lead, the point adapter including a housing and a slide ring carried on a slide tube in the housing, the slide ring connected to a point, wherein when the point adapter is inserted into the alligator clip connector jack, the slide ring can be moved in a first direction along the slide tube to extend the point outward beyond the jaws of the alligator clip.

The plug-in point adapter may be further characterized as above and wherein the slide ring can be moved in a second direction along the slide tube to retract an extended point back into the alligator clip; wherein the housing includes an adapter jack for connection to a plug on a wire lead; or wherein the housing includes an integral wire lead and plug.

The plug-in point adapter may be further characterized as above and wherein the housing includes at least one groove, and the slide ring includes a post that can be rotated to engage the post in the at least one groove to latch and temporarily lock the point in an extended position; or wherein the housing includes two grooves at different locations on the housing, and the post can be selectively engaged in either groove to latch and temporarily lock the point in different extended positions.

The plug-in point adapter may be further characterized as above and wherein the slide ring is connected to the point at a point support; wherein the point support travels through a longitudinal slot in the slide tube when the slide ring is moved along the slide tube; or wherein the slide tube plugs into the connector jack of the alligator clip and encloses a metal rod that attaches into the connector jack on the alligator clip and transfers this connection to the adapter at downwardly-depending adapter jack.

The plug-in point adapter may be further characterized as above and wherein the housing includes a cap that can be opened to enable removal of the point from the housing and replacement with a different point.

The plug-in point adapter may be further characterized as above and wherein the housing, slide ring, and slide tube are constructed of plastic; or wherein the point is metal, and is completely covered by the slide tube, slide ring, and housing when the point is retracted.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A point adapter for an alligator clip, the alligator clip having a pair of jaws and a connector jack for connection to a plug on a wire lead, the point adapter comprising:
   a housing; and
   a slide ring carried on a slide tube in the housing, the slide ring connected to a point, wherein when the point adapter is inserted into the alligator clip connector jack, the slide ring can be moved in a first direction along the slide tube to extend the point outward beyond the jaws of the alligator clip, and wherein the housing includes at least one groove, and the slide ring includes a post that can be rotated to engage the post in the at least one groove to latch and temporarily lock the point in an extended position.

2. The point adapter for an alligator clip of claim 1 wherein the slide ring can be moved in a second direction along the slide tube to retract an extended point back into the alligator clip.

3. The point adapter for an alligator clip of claim 1 wherein the housing includes an adapter jack for connection to a plug on a wire lead.

4. The point adapter for an alligator clip of claim 1 wherein the housing includes an integral wire lead and plug.

5. The point adapter for an alligator clip of claim 1 wherein the housing includes two grooves at different locations on the housing, and the post can be selectively engaged in either groove to latch and temporarily lock the point in different extended positions.

6. The point adapter for an alligator clip of claim 1 wherein the slide ring is connected to the point at a point support.

7. The point adapter for an alligator clip of claim 6 wherein the point support travels through a longitudinal slot in the slide tube when the slide ring is moved along the slide tube.

8. The point adapter for an alligator clip of claim 6 wherein the point support travels through a longitudinal slot in the slide tube when the slide ring is moved along the slide tube.

9. The point adapter for an alligator clip of claim 1 wherein the slide tube plugs into the connector jack of the alligator clip and encloses a metal rod that attaches into the connector jack on the alligator clip and connects to an adapter jack on the point adapter.

10. The point adapter for an alligator clip of claim 1 wherein the housing includes a cap that can be opened to enable removal of the point from the housing and replacement with a different point.

11. The point adapter for an alligator clip of claim 1 wherein the housing, slide ring, and slide tube are constructed of plastic.

12. The point adapter for an alligator clip of claim 1 wherein the point is metal, and is completely covered by the slide tube, slide ring, and housing when the point is retracted.

13. A point adapter for an alligator clip, the alligator clip having a pair of jaws and a connector jack for connection to a plug on a wire lead, the point adapter comprising:

a housing; and a slide ring carried on a slide tube in the housing, the slide ring connected to a point, wherein when the point adapter is inserted into the alligator clip connector jack, the slide ring can be moved in a first direction along the slide tube to extend the point outward beyond the jaws of the alligator clip, and wherein the slide tube plugs into the connector jack of the alligator clip and encloses a metal rod that attaches into the connector jack on the alligator clip and connects to an adapter jack on the point adapter.

14. The point adapter for an alligator clip of claim 13 wherein the slide ring can be moved in a second direction along the slide tube to retract an extended point back into the alligator clip.

15. The point adapter for an alligator clip of claim 13 wherein the housing includes an adapter jack for connection to a plug on a wire lead.

16. The point adapter for an alligator clip of claim 13 wherein the housing includes an integral wire lead and plug.

17. The point adapter for an alligator clip of claim 13 wherein the housing includes at least one groove, and the slide ring includes a post that can be rotated to engage the post in the at least one groove to latch and temporarily lock the point in an extended position.

18. The point adapter for an alligator clip of claim 17 wherein the housing includes two grooves at different locations on the housing, and the post can be selectively engaged in either groove to latch and temporarily lock the point in different extended positions.

19. The point adapter for an alligator clip of claim 13 wherein the slide ring is connected to the point at a point support.

20. The point adapter for an alligator clip of claim 13 wherein the point is metal, and is completely covered by the slide tube, slide ring, and housing when the point is retracted.

* * * * *